(12) United States Patent
Divakaruni et al.

(10) Patent No.: US 6,656,817 B2
(45) Date of Patent: Dec. 2, 2003

(54) METHOD OF FILLING ISOLATION TRENCHES IN A SUBSTRATE

(75) Inventors: Ramachandra Divakaruni, Ossining, NY (US); Laertis Economikos, Wappingers Falls, NY (US); Byeong Y. Kim, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 10/136,097

(22) Filed: Apr. 30, 2002

(65) Prior Publication Data

US 2003/0203595 A1 Oct. 30, 2003

(51) Int. Cl.[7] .............................................. H01L 21/76
(52) U.S. Cl. ...................................................... 438/435
(58) Field of Search ................................ 438/435, 437, 438/444, 424

(56) References Cited

U.S. PATENT DOCUMENTS 6,180,493 B1 * 1/2001 Chu
6,420,232 B1 * 7/2002 Wu

OTHER PUBLICATIONS

J.T. Pye et al. "High–Density Plasma CVD and CMP for 0.25um intermetal dielectric processing" Solid State Technology, Dec. 1995, pp. 65–69.*

* cited by examiner

Primary Examiner—Craig Thompson
(74) Attorney, Agent, or Firm—Daryl K. Neff; Todd M. C. Li

(57) ABSTRACT

Disclosed herein is a method of filling isolation trenches in a substrate. The method includes anisotropically etching trenches in a surface of a substrate and partially filling the trenches with a deposited oxide. As a consequence of the deposition, the oxide accumulates in mounds on the surface between trenches. The trenches are then filled with a supporting material of a highly flowable material such as anti-reflective coating (ARC), low-K dielectric, or a spin-on-polymer, or alternatively, a supporting material of polysilicon. A flattening process is then applied to lower the mound topography. The supporting material is then removed and the filling of the trenches with oxide is then continued. When polysilicon is used as the supporting material, the mounds are removed by wet etching prior to removing the polysilicon.

20 Claims, 3 Drawing Sheets

METHOD OF FILLING ISOLATION TRENCHES IN A SUBSTRATE

FIELD OF THE INVENTION

The present invention relates to front end of line (FEOL) semiconductor processing, and more specifically to a FEOL method for oxide filling of trenches and optionally planarizing a substrate thereafter for subsequent processing.

BACKGROUND OF THE INVENTION

As device sizes shrink and vertical transistors come into use, isolation trenches are being fabricated with increased aspect ratios (height to width) greater than 1:1, often exceeding 5:1. Such high aspect ratio isolation trenches are needed to fully block currents from moving within the substrate between active devices, especially devices having a vertically oriented channel which lie below the substrate surface and are close to each other. It is becoming more difficult to fill such high aspect ratio trenches and assure that voids are not left in the fill, despite the use of high quality filling processes such as high density plasma (HDP) oxide. Voids in the fill of an isolation trench can make a short circuit between conductor wires by trapping conductor material in the void during subsequent process steps.

Planarization poses another difficulty. The surface of a substrate must be planarized after isolation trenches are filled. However, some trench filling processes result in high and narrow width mounding of the deposited oxide above the surface of the substrate. Because of such topography, the horizontal forces in planarization by only chemical mechanical polishing (CMP) risks irreparably damaging the substrate by fracturing the substrate or pad material (e.g. pad nitride) which lies below the oxide mounds.

SUMMARY OF THE INVENTION

Accordingly, the present invention provides a method of forming and filling isolation trenches in a substrate. The method includes anisotropically etching trenches in a surface of a substrate and partially filling the trenches with a deposited oxide. As a byproduct of the partial filling, the oxide accumulates in mounds on the surface between trenches. The trenches are then filled with a supporting material, e.g. a highly flowable material such as polymer of the type commonly used in semiconductor processing as an anti-reflective coating (ARC), low-K dielectric, spin-on-polymer, or alternatively, a supporting material of polysilicon. When the supporting material is polysilicon, the oxide mounds on the upper sidewalls of the trench are first wet etched, and a liner of silicon nitride is preferably deposited prior to depositing the polysilicon. Once the supporting material is in place, a flattening process is applied to lower the topography of the mounds. The flattening process may include polishing with a fixed abrasive pad or, alternatively, chemical mechanical polishing and a directional (e.g. reactive ion type) etch. Thereafter, the supporting material is removed, and oxide deposition to fill the trenches is continued.

Preferably, the oxide is deposited by high density plasma (HDP). Preferably, the oxide filling of the trenches is performed by a series of alternating deposition and etchback steps. After the supporting material is removed and the trenches are completely filled with oxide, the substrate is preferably planarized by chemical mechanical polishing (CMP) with a slurry composition preferably including a ceria base.

DETAILED DESCRIPTION OF THE PREFERRED EMBODIMENTS

The present invention is preferably employed in a semiconductor fabrication process for the purpose of filling isolation trenches between locations of active area, prior to processing the active area into transistors or other electrically active structures.

Figure 1:
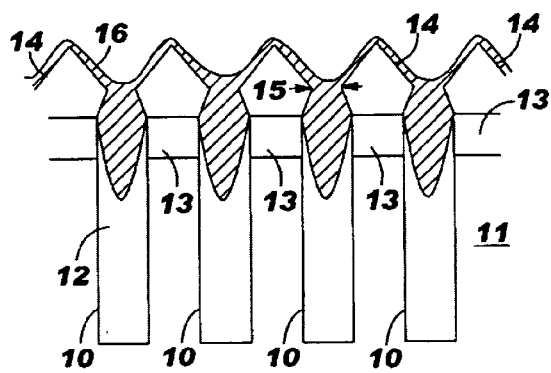
FIGS. 1–6 illustrate an isolation trench filling process according to a first embodiment of the invention.

According to a first embodiment of the invention, FIG. 1 illustrates a region of isolation trenches 10 that have been etched in a substrate 11 and then partially filled with an oxide 12. Substrate 10 is preferably formed of a semiconductor, for example, without limitation, silicon, germanium, gallium arsenide or other semiconductor compound, or a semiconductor on insulator (SOI) substrate. Typically, the trenches 10 are etched to have an aspect ratio of height to width greater than 1:1 ("high aspect ratio") and may be 5:1 or even greater. A pad material 13, preferably of silicon nitride (SiN) is formed on substrate 11 prior to etching and filling trenches 10.

The oxide fill 12 is deposited preferably by high density plasma (HDP). As a consequence of such oxide deposition, mounds 14 of deposited oxide material form over the pad material 13. Such mounds 14 rise up considerably from the pad material 13. When the trenches 10 have high aspect ratios, the height of the mounds 10 may be increased by a series of alternating oxide deposition and etchback steps that are performed to fill trenches 10 while preventing the openings 15 between mounds 14 over the trenches 10 from closing up. FIG. 1 shows mounds 14 as they appear after one or more oxide depositions, prior to an intervening etchback.

Trenches 10 are then filled with a supporting material 16. In this first embodiment, the supporting material 16 is a highly flowable material such as a polymer, preferably of the type used in semiconductor processing as an anti-reflective coating (ARC), a low-K dielectric material, or a spin-on-polymer such as that sold under the name Accuflow (TM) by Honeywell. The highly flowable material 16 fills the trenches 10 and spaces between the pad material 13 as a supporting material to protect substrate 11 and pad material 13 from damage during a subsequent abrading step. The highly flowable material 16 is then hardened by heating to a sufficient temperature, preferably by applying heat to the substrate or a top surface thereof.

Figure 2:
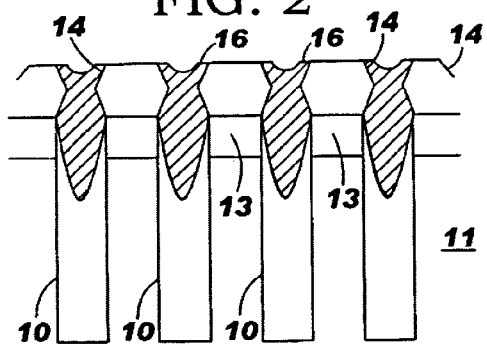

Next, as shown in FIG. 2, a flattening process is applied to smooth the topography of mounds 14. The flattening process can be performed in alternative ways. In a first alternative, mounds 14 are mechanically abraded, preferably by polishing with a fixed abrasive pad. Such abrasion results in an overall flattening of the mounds 14. Supporting material 16 prevents pad material 13 or substrate 11 from being damaged from the mechanical abrasion process, as might occur if the mounds 14 were unsupported and could be moved and broken away from substrate 11 by the horizontal forces of the abrasion process.

In a second alternative flattening process, the mounds 14 are flattened by chemical mechanical polishing with a silica slurry, followed by a directional etch, for example reactive ion etch (RIE), resulting in at least partial planarization and lowered height of mounds 14. Alternatively, the directional etch can be performed before CMP polishing with a silica slurry.

Figure 4:
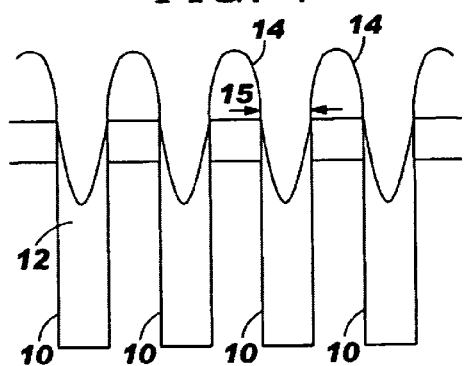
Figure 5:
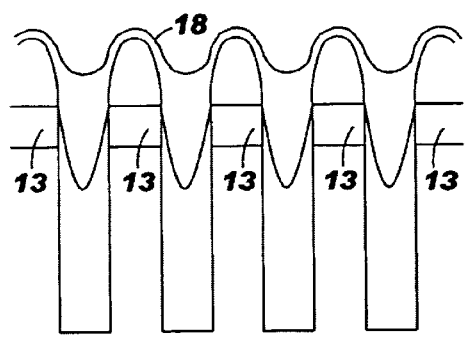
Figure 3:
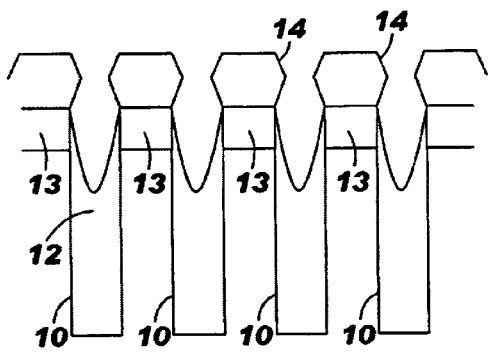
Figure 6:
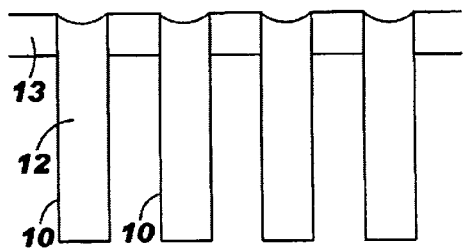

Next, as shown in FIG. 3, the supporting material 16 is removed, as by wet etching the material selective to oxide and nitride, such that oxide fill 12 and pad nitride 13 remain. Then, as shown in FIG. 4, the oxide is wet etched (isotropically) such that mounds 14 are etched back, and openings 15 between adjacent trenches 10 become larger. Oxide deposition into trenches 10 is then continued, as shown in FIG. 5, resulting in filling trenches 10 with oxide 18 up to or above the level of the pad material 13. Finally, as shown in FIG. 6, chemical mechanical polishing (CMP) of the oxide is performed to planarize the surface of the substrate 11 to the level of the pad material 13. This is performed preferably with a CMP process using an etchant slurry component which is selective to the pad material 13 such as silicon nitride, or which endpoints when the pad material 13 appears. When the pad material 13 is silicon nitride, it is preferable to perform CMP using a ceria-based slurry, as it is highly selective to silicon nitride. Isolation trenches 10 are now completely filled with oxide 12 and planarized to the level of the pad material 13.

Figure 7:
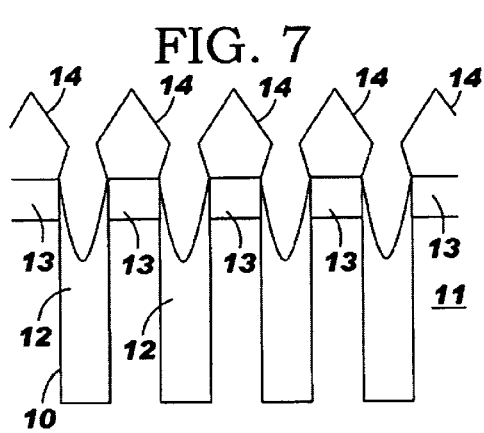
FIGS. 7–13 illustrate an isolation trench filling process according to a second embodiment of the invention.

In the embodiment described above, the mound flattening CMP is performed after at least one oxide deposition into trenches, and preferably after more than one deposition and etchback when more than two deposition and etchback cycles are required to completely fill trenches 10. A second embodiment of the invention will now be described, with reference to FIGS. 7–13. With reference to FIG. 7, trenches 10, typically having aspect ratios (height to width) greater than 1:1 (high aspect ratio), and perhaps 5:1 or greater, are etched into a substrate 11 which is covered by an overlying pad material 13, preferably of silicon nitride. The trenches 10 are then partially filled with an oxide 12, preferably by high density plasma (HDP) deposition. As a consequence of the oxide fill process, mounds 14 are formed over the pad material 13. A small size opening 15 exists between adjacent mounds 14.

Figure 8:
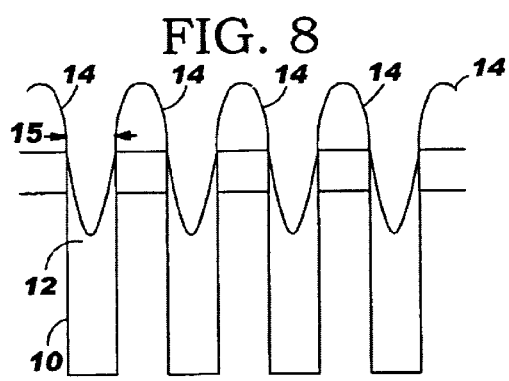

Referring to FIG. 8, the oxide 12 is then etched back, preferably with a wet (isotropic) process, selective to nitride, resulting in mounds 14 having a shorter, more rounded shape and the opening 15 being increased in size. At the conclusion of this etch step, it is important that oxide 12 be cleared from at least an upper sidewall 13a of the pad nitride 13 in trenches 10, such that a later performed isotropic oxide etch of mounds 14 (FIG. 10) does not proceed down along sidewalls of the pad nitride 13 and into the oxide 12 which fills the trench in the semiconductor substrate. The oxide 12 on the sidewalls of pad nitride 13 can be removed by adjusting the etchback amount in this step.

Figure 9:
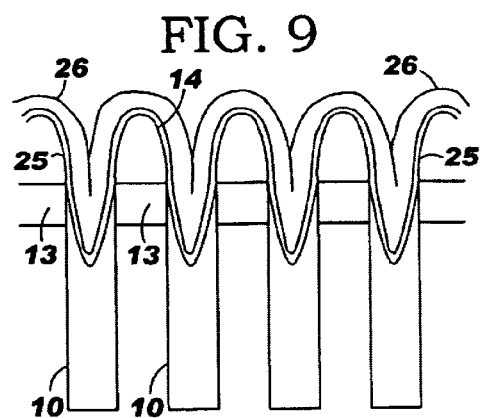

Next, as shown in FIG. 9, a liner material 25, preferably of silicon nitride, is then deposited, and a supporting material 26 of polysilicon is deposited to fill the remaining space between trenches 10 and the space between the pad material 13 over the trenches 10. Such supporting material 26 provides mechanical support for subsequent mechanical abrasion.

Figure 10:
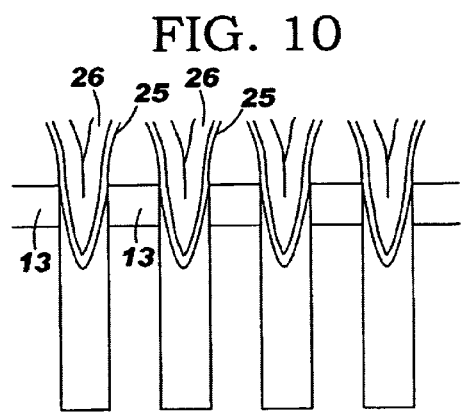

With reference to FIG. 10, the polysilicon supporting material 26 is now mechanically abraded using chemical mechanical polishing (CMP) which is selective to the deposited oxide and the material of liner 25 (being, for example, silicon nitride). As a result of such CMP process, the tops of oxide mounds 14 are exposed. After the polysilicon CMP process, the exposed liner 25 is etched, and then the oxide mounds 14 are wet etched (isotropically), to clear the oxide mounds 14 from over the surface of pad material 13. Now, only the polysilicon 26 and the liner 25 remain above the surface of pad material 13. The resulting structure is shown in FIG. 10.

Figure 11:
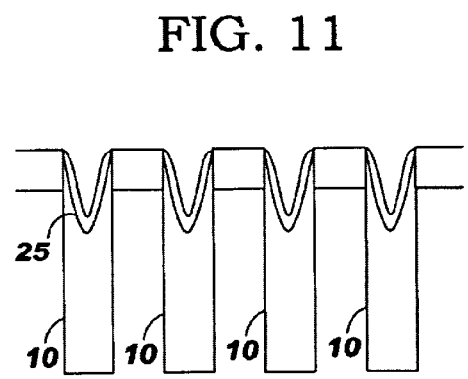

Next, as illustrated in FIG. 11, the liner 25 is preferably wet etched (isotropically), followed by the removal of the polysilicon 26 from trenches 10, also by wet etching (isotropically). Within trenches 10, liner 25 remains because it is not exposed until after the polysilicon 26 is removed from trenches 10.

Figure 12:
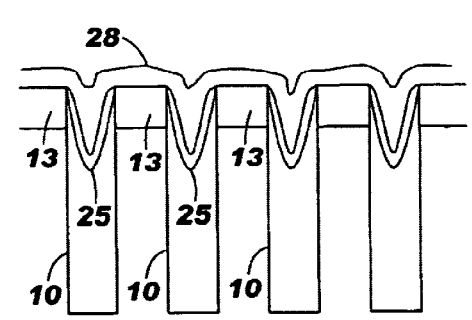

Next, as illustrated in FIG. 12, the filling of trenches 10 with an oxide 28 continues, such that the space between trenches 10 and between the pad material 13 is filled with oxide 28. The presence of liner 25 does not interfere with desired dielectric properties of the isolation fill, so long as the liner is of a compatible dielectric material, for example of silicon nitride.

Figure 13:
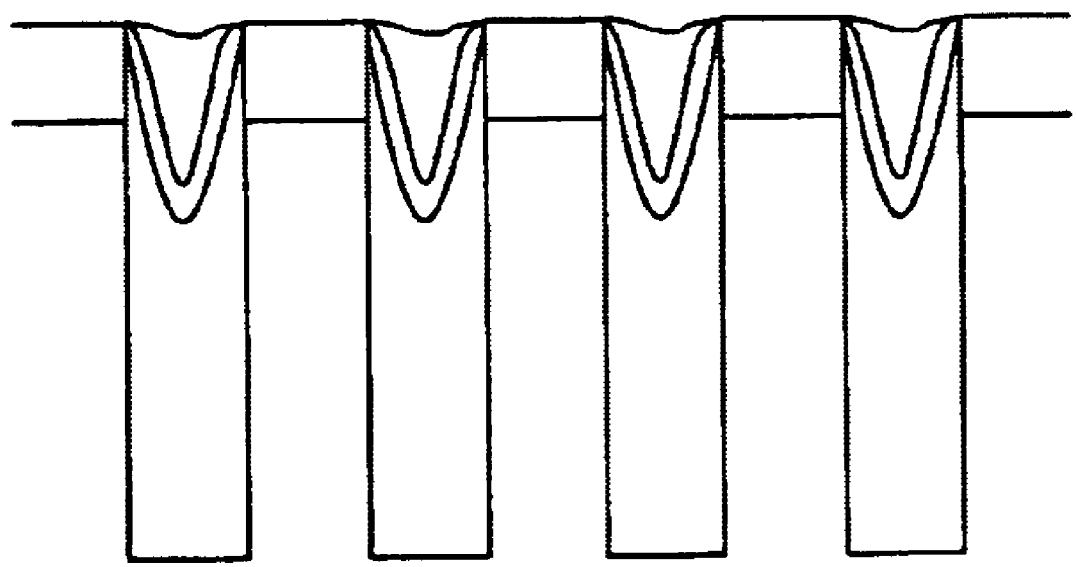

Finally, the substrate is planarized to the surface of pad material 13, resulting in the structure shown in FIG. 13. The substrate is then ready for further front end of line (FEOL) processing of the active area, etc., for the formation of transistors and other active or conductive structures on the substrate surface.

While the invention has been described with reference to certain preferred embodiments thereof, those skilled in the art will recognize the many modifications and enhancements which can be made without departing from the true scope and spirit of the invention which is limited only by the appended claims.

What is claimed is:

1. Method of forming and filling isolation trenches in a substrate, comprising:
   anisotropically etching trenches in a surface of a substrate;
   partially filling said trenches with a deposited oxide, whereby said oxide accumulates in mounds on said surface between ones of said trenches;
   filling said trenches with a supporting material;
   polishing said substrate to flatten said mounds;
   removing said supporting material; and
   continuing to fill said trenches with a deposited oxide.

2. The method according to claim 1 wherein said oxide is deposited by high density plasma (HDP).

3. The method according to claim 1 wherein said supporting material is a highly flowable material comprising a polymer, said method further comprising hardening said supporting material.

4. The method according to claim 3 wherein said hardening is performed by heating.

5. The method according to claim 4 wherein said supporting material comprises a polymer of the anti-reflective coating (ARC) type.

6. The method according to claim 1 wherein said supporting material comprises polysilicon, and further comprising removing said mounds by wet etching prior to removing said supporting material.

7. The method according to claim 6 further comprising depositing a liner prior to filling said trenches with said supporting material.

8. The method according to claim 1 wherein said substrate is polished with a fixed abrasive pad.

9. The method according to claim 1 further comprising planarizing said substrate after said continuing to fill said trenches.

10. The method according to claim 9 wherein said planarizing is performed by chemical mechanical polishing (CMP).

11. The method according to claim 10 wherein said CMP is performed with a ceria based slurry.

12. The method according to claim 1 wherein said step of partially filling is performed by alternating steps of depositing said dense oxide and etching back said deposited oxide.

13. Method of forming and filling isolation trenches in a substrate, comprising:

anisotropically etching trenches in a surface of a substrate;

partially filling said trenches with an oxide by high density plasma (HDP) deposition, whereby said oxide accumulates in mounds on said surface between ones of said trenches;

filling said trenches with a supporting material comprising a material selected from the group consisting of anti-reflective coating (ARC) type polymer and spin-on-polymer, and hardening said ARC type polymer by heating;

polishing said substrate to flatten said mounds;

removing said supporting material; and continuing to fill said trenches with an oxide by HDP deposition.

14. The method according to claim 13 further comprising planarizing said substrate by chemical mechanical polishing (CMP) after said continuing to fill said trenches.

15. The method according to claim 14 wherein said CMP is performed with a ceria based slurry.

16. The method according to claim 13 wherein said step of partially filling is performed by alternating steps of depositing said oxide and etching said deposited oxide back.

17. Method of forming and filling isolation trenches in a substrate, comprising:

anisotropically etching trenches in a surface of a substrate;

partially filling said trenches with an oxide by high density plasma (HDP) deposition, whereby said oxide accumulates in mounds on said surface between ones of said trenches;

filling said trenches with a supporting material comprising polysilicon;

polishing said substrate to flatten said mounds;

removing said mounds by wet etching;

removing said supporting material; and continuing to fill said trenches with an oxide by HDP deposition.

18. The method according to claim 17 further comprising depositing a nitride liner prior to filling said trenches with said supporting material.

19. The method according to claim 18 further comprising removing said nitride liner prior to removing said supporting material.

20. The method according to claim 17 further comprising planarizing said substrate by chemical mechanical polishing (CMP) with a ceria based slurry after said continuing to fill said trenches.

* * * * *